United States Patent
Ding (10) Patent No.: US 6,506,287 B1
(45) Date of Patent: Jan. 14, 2003

(54) OVERLAP DESIGN OF ONE-TURN COIL

(75) Inventor: Peijun Ding, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/039,695

(22) Filed: Mar. 16, 1998

(51) Int. Cl.[7] ............................................. C23C 14/32
(52) U.S. Cl. ........................... 204/192.12; 204/298.06; 204/298.12; 204/298.16
(58) Field of Search ...................... 204/192.12, 298.06, 204/298.16, 298.19, 298.12

(56) References Cited

U.S. PATENT DOCUMENTS

| | | | |
|---|---|---|---|
| 118,252 A | 8/1871 | Lewis ....................... | 24/20 EF |
| 565,698 A | 8/1896 | Sparks ...................... | 24/20 EE |
| 4,154,011 A | 5/1979 | Rakestraw et al. ........... | 40/633 |
| 4,336,118 A | 6/1982 | Patten et al. ........... | 204/192.12 |
| 4,361,472 A | 11/1982 | Morrison, Jr. ......... | 204/192.12 |
| 4,422,896 A | 12/1983 | Class et al. .................... | 216/67 |
| 4,478,437 A | 10/1984 | Skinner ...................... | 285/189 |
| 4,626,312 A | 12/1986 | Tracy ......................... | 156/345 |
| 4,661,228 A | 4/1987 | Mintz .................... | 204/192.25 |
| 4,871,421 A | 10/1989 | Ogle et al. .................. | 438/710 |
| 4,941,915 A | 7/1990 | Matsuoka et al. ..... | 204/298.12 |

(List continued on next page.)

FOREIGN PATENT DOCUMENTS

| | | |
|---|---|---|
| EP | 0601595 | 12/1993 |
| EP | 0907797 | 1/1994 |
| EP | 0653776 | 10/1994 |
| EP | 0727807 | 1/1996 |
| EP | 0727923 | 2/1996 |
| EP | 0758148 | 8/1996 |
| EP | 0807954 | 11/1997 |
| EP | 0813227 | 12/1997 |
| EP | 0836218 | 4/1998 |
| EP | 0836219 | 4/1998 |
| EP | 0840351 | 5/1998 |
| JP | 59190363 | 10/1984 |
| JP | 888190 | 4/1996 |
| WO | 9515372 | 6/1995 |

OTHER PUBLICATIONS

Search report in PCT/US99/05265 issued Jul. 5, 1999.
U.S. patent application Ser. No. 29/109,892.
U.S. patent application Ser. No. 29/109,870.
U.S. patent application Ser. No. 29/109,893.
US 08/559,345, filed Nov. 15, 1995 (Atty Dkt 938.X1/4479).
US 08/730,722, filed Oct. 8, 1996 (Atty Dkt 1207/4784).
US 09/049,276, filed Mar. 27, 1998 (Atty Dkt 938.D2/5703).
US 09/049,839, filed Mar. 27, 1998 (Atty Dkt 938.D1/5702).
Applied Materials, Exhibit A, dated more than one year prior to Mar. 16, 1998 (the filing date of the present application); Exhibit A is a drawing of a coil design which was created prior to the design of the present application.
Search report in PCT/US98/10058 issued Nov. 4, 1998.
PCT Search Report issued in Appln PCT/US98/09739.
U.S. patent application Ser. No. 09/113,577 (Atty. Dkt. 2734).
U.S. patent application Ser. No. 29/090,618 (Atty. Dkt. 2734.D1).
U.S. patent application Ser. No. 29/090,631 (Atty. Dkt. 2734.D2).

*Primary Examiner*—Rodney G. McDonald
(74) *Attorney, Agent, or Firm*—Konrad Raynes Victor & Mann LLP (57) ABSTRACT

A coil for inductively coupling RF energy to a plasma in a substrate processing chamber has adjacent spaced and overlapping ends to improve uniformity of processing of the substrate.

40 Claims, 5 Drawing Sheets

U.S. PATENT DOCUMENTS

| | | | |
|---|---|---|---|
| 4,999,096 A | 3/1991 | Nihei et al. | 204/192.3 |
| 5,001,816 A | 3/1991 | Oetiker | 24/20 EE |
| 5,102,496 A | 4/1992 | Savas | 216/69 |
| 5,135,634 A | 8/1992 | Clarke | 204/298.06 |
| 5,150,503 A | 9/1992 | Müller | 24/20 EE |
| 5,178,739 A | 1/1993 | Barnes et al. | 204/192.12 |
| 5,198,725 A | 3/1993 | Chen et al. | 315/111.41 |
| 5,231,334 A | 7/1993 | Paranjpe | 315/111.21 |
| 5,401,350 A | 3/1995 | Patrick et al. | 156/345 |
| 5,430,355 A | 7/1995 | Paranjpe | 315/111.21 |
| 5,433,812 A | 7/1995 | Cuomo et al. | 156/345 |
| 5,434,353 A | 7/1995 | Kraus | 174/15.6 |
| 5,503,676 A | 4/1996 | Shufflebotham et al. | 118/723 MR |
| 5,556,501 A | 9/1996 | Collins et al. | 156/345 |
| 5,573,595 A | 11/1996 | Dible | 118/723 MP |
| 5,637,961 A | 6/1997 | Ishii et al. | 315/111.51 |
| 5,669,975 A | 9/1997 | Ashtiani | 118/723 I |
| 5,681,393 A * | 10/1997 | Takagi | 118/723 I |
| 5,683,537 A | 11/1997 | Ishii | 156/345 |
| 5,690,781 A | 11/1997 | Yoshida et al. | 156/345 |
| 5,707,498 A | 1/1998 | Ngan | 204/192.12 |
| 5,721,021 A | 2/1998 | Tobe et al. | 427/570 |
| 5,770,098 A | 6/1998 | Araki et al. | 216/67 |
| 5,783,492 A | 7/1998 | Higuchi et al. | 438/710 |
| 5,810,931 A | 9/1998 | Stevens et al. | 118/721 |
| 6,254,737 B1 * | 7/2001 | Edelstein et al. | 204/192.12 |

* cited by examiner

OVERLAP DESIGN OF ONE-TURN COIL

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created within the plasma impact the surface of the target to dislodge, i.e., "sputter" material from the target. The sputtered materials are then transported and deposited on the surface of the semiconductor wafer.

Sputtered material has a tendency to travel in straight line paths from the target to the substrate being deposited at angles which are oblique to the surface of the substrate. As a consequence, materials deposited in etched trenches and holes of semiconductor devices having trenches or holes with a high depth to width aspect ratio, can buildup an overhang which can bridge over causing undesirable cavities in the deposition layer. To prevent such overhang, the sputtered material can be redirected into substantially vertical paths between the target and the substrate by negatively charging the substrate and positioning appropriate vertically oriented electric fields adjacent the substrate if the sputtered material is sufficiently ionized by the plasma. However, material sputtered by a low density plasma often has an ionization degree of less than 1% which is usually insufficient to avoid the formation of overhangs. Accordingly, it is desirable to increase the density of the plasma to increase the ionization rate of the sputtered material in order to decrease unwanted overhang formation in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil induces electromagnetic fields and generates a high density plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

In many high density plasma applications, it is preferable for the chamber to be operated at a relatively high pressure so that the frequency of collisions between the plasma ions or plasma precursor gas atoms and the deposition material atoms is increased to increase thereby the resident time of the sputtered material in the high density plasma zone. As a consequence, the likelihood that deposition material atoms may be ionized is increased thereby increasing the overall ionization rate. However, scattering of the deposition atoms is likewise increased. This scattering of the deposition atoms often causes the thickness of the deposition layer on the substrate to be thicker on that portion of the substrate aligned with the center of the target and thinner in the outlying regions.

In order to improve the uniformity of deposition, the coil which is used to couple RF energy into the plasma has been adapted to sputter material from the coil onto the workpiece to supplement the material being sputtered from a target onto the workpiece, as set forth in greater detail in copending application Ser. No. 08/680,335, filed Jul. 10, 1996 now abandoned, entitled "Coils for Generating a Plasma and for Sputtering" by Jaim Nulman et al., which is assigned to the assignee of the present application and is incorporated herein by reference in its entirety. As discussed therein, the coil is positioned adjacent to the substrate so that material sputtered from the coil is deposited primarily onto the periphery of the workpiece. One end of the coil is coupled to an RF generator and the other end of the coil is coupled to the system ground, typically through a blocking capacitor to develop a DC bias on the coil to facilitate sputtering of the coil. If the coil is a single turn coil, the ends of the coil are typically positioned close together but spaced by a gap (typically on the order of ¼ inch (4–8 mm)) to prevent a short between the RF generator and the blocking capacitor which would bypass the coil.

Although sputtering material from the coil onto the workpiece can improve the uniformity of deposition, it has been noted by the present applicant that nonuniformities in the deposition can nonetheless occur. Accordingly, further improvements in deposition uniformity is desired.

SUMMARY OF THE PREFERRED EMBODIMENTS

It is an object of the present invention to provide an improved method and apparatus for generating a plasma within a chamber and for sputter depositing a layer which obviate, for practical purposes, the above-mentioned limitations.

These and other objects and advantages are achieved by, in accordance with one aspect of the invention, a plasma generating apparatus which inductively couples electromagnetic energy and sputters material from a coil which has two spaced but overlapping ends. It has been recognized by the present applicant that the gap which normally spaces the two ends of a prior single turn coil may cause a discontinuity in the deposition rate of material sputtered from the coil onto the portion of the substrate closest to the coil gap as compared to other portions of the substrate. By overlapping the two ends of the coil in a close but spaced relationship, it is believed that the coil can provide a more uniform source of deposition material around the circumference of the coil, even adjacent to the ends. It is further believed that such a coil can improve the plasma uniformity adjacent to the coil ends.

In several illustrated embodiments, the coil ends overlap in a direction generally parallel to the axis of the substrate holder and the substrate supported on the holder. In alternative illustrated embodiments, the coil ends overlap radially. In each of the embodiments described herein below, it is believed that such overlapping of the coil ends can improve the quality of the layer deposited onto the substrate.

DETAILED DESCRIPTION OF THE DRAWINGS

Figure 1:
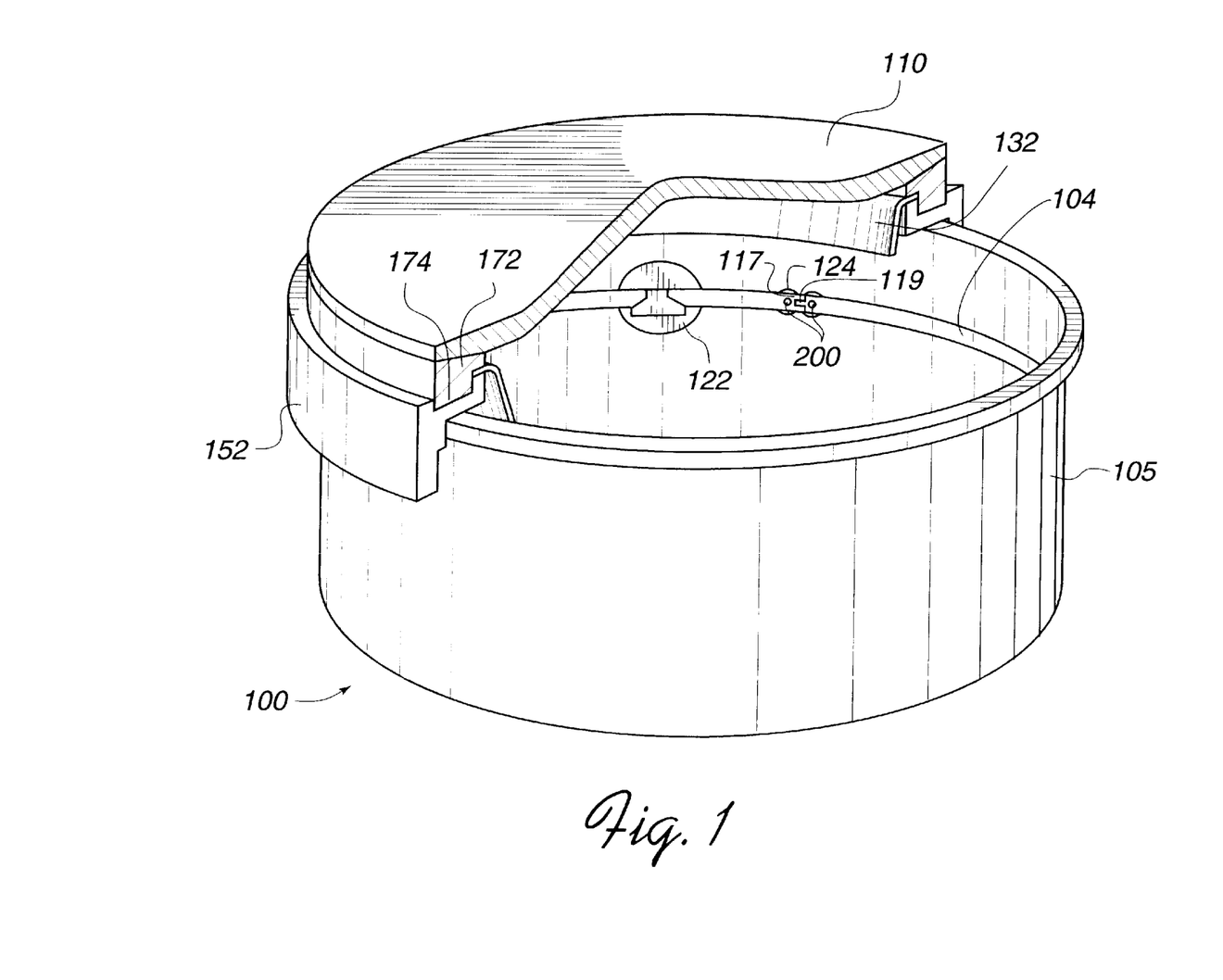
FIG. 1 is a perspective, partial cross-sectional view of a plasma generating chamber in accordance with one embodiment of the present invention.
Figure 2:
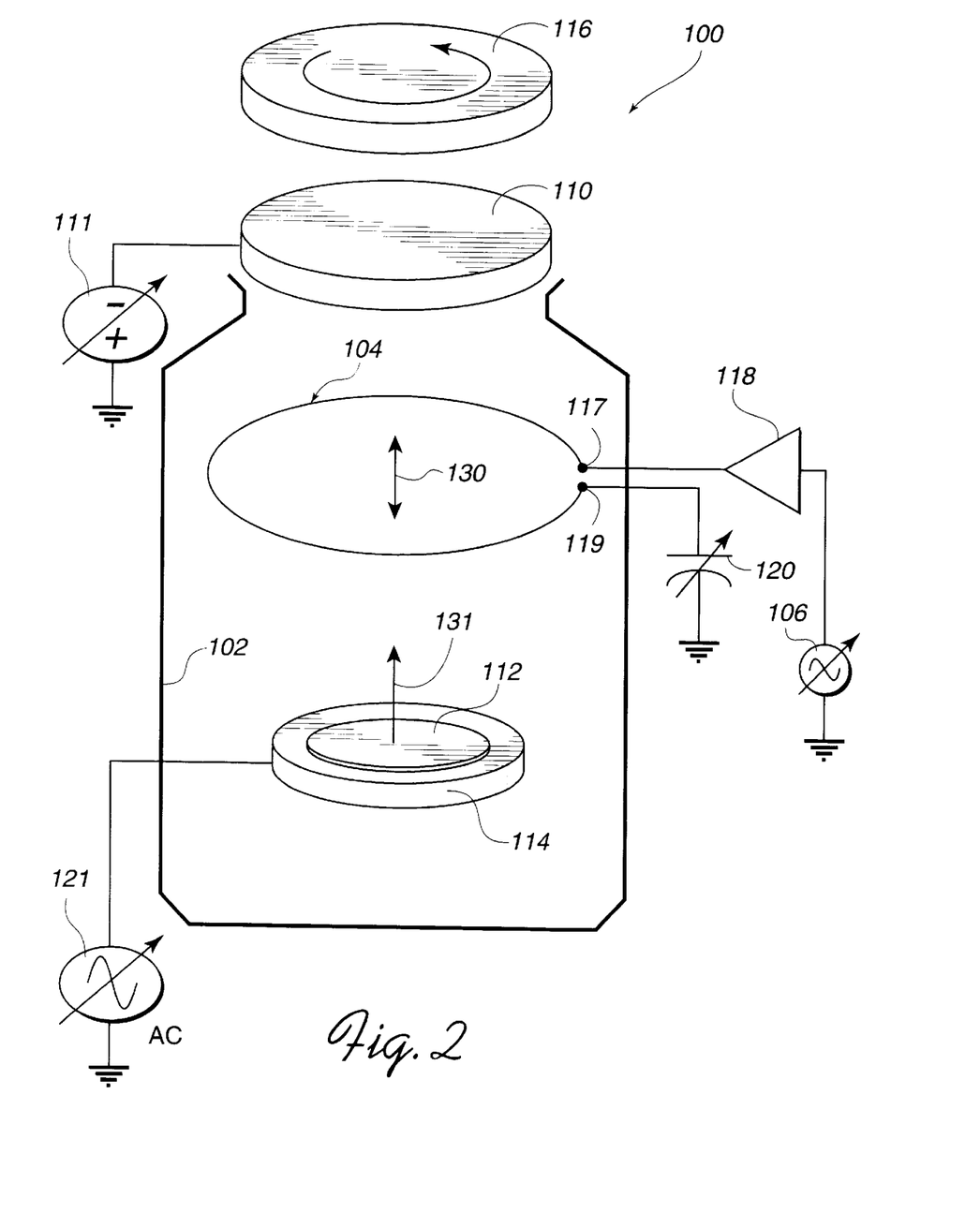
FIG. 2 is a schematic diagram of the electrical interconnections to the plasma generating chamber of FIG. 1.

Referring first to FIGS. 1 and 2, a plasma generator in accordance with a first embodiment of the present invention comprises a substantially cylindrical plasma chamber 100 which is received in a vacuum chamber 102 (shown schematically in FIG. 2). The plasma chamber 100 of this embodiment has a single turn coil 104 which, as described in greater detail below, has overlapping ends which permit improved deposition uniformity. The coil 104 is carried internally by a shield 105 which protects the interior walls (not shown) of the vacuum chamber 102 from the material being deposited within the interior of the plasma chamber 100.

Radio frequency (RF) energy from an RF generator 106 is radiated from the coil 104 into the interior of the deposition system 100, which energizes a plasma within the deposition system 100, to ionize material sputtered from a target 110 positioned at the top of the chamber 102. The target 110 is negatively biased by a DC power source 111 to attract sputtering ions. Ions impacting the target 110 eject material from the target onto a substrate 112 which may be a wafer or other workpiece which is supported by a pedestal 114 at the bottom of the deposition system 100. A rotating magnet assembly 116 provided above the target 110 produces magnetic fields which sweep over the face of the target 110 to promote uniform erosion of the target.

As set forth above, the atoms of material ejected from the target 110 are in turn ionized by the plasma being energized by the coil 104 which is inductively coupled to the plasma. The RF generator 106 is preferably coupled to one end 117 of the coil 104 through an amplifier and impedance matching network 118. The other end 119 of the coil 104 is coupled to ground, preferably through a capacitor 120 which may be a variable capacitor. The ionized deposition material is attracted to the substrate 112 and forms a deposition layer thereon. The pedestal 114 may be negatively biased by an AC (or DC or RF) source 121 so as to externally bias the substrate 112.

As explained in greater detail in the copending application Ser. No. 08/680,335, material is also sputtered from the coil 104 onto the substrate 112 to supplement the material which is being sputtered from the target 110 onto the workpiece. As a result, the layer deposited onto the substrate 112 is formed from material from both the coil 104 and the target 110 which can substantially improve the uniformity of the resultant layer. The material sputtered from the target 110 tends to deposit more thickly in the center of the workpiece as compared to the edges. However, the material sputtered from the coil 104 tends to deposit more thickly at the edges of the workpiece as compared to the center of the workpiece. As a consequence, the materials deposited from the coil and the target can combine to form a layer of improved uniform thickness from the center of the workpiece to its edges.

Figure 8:
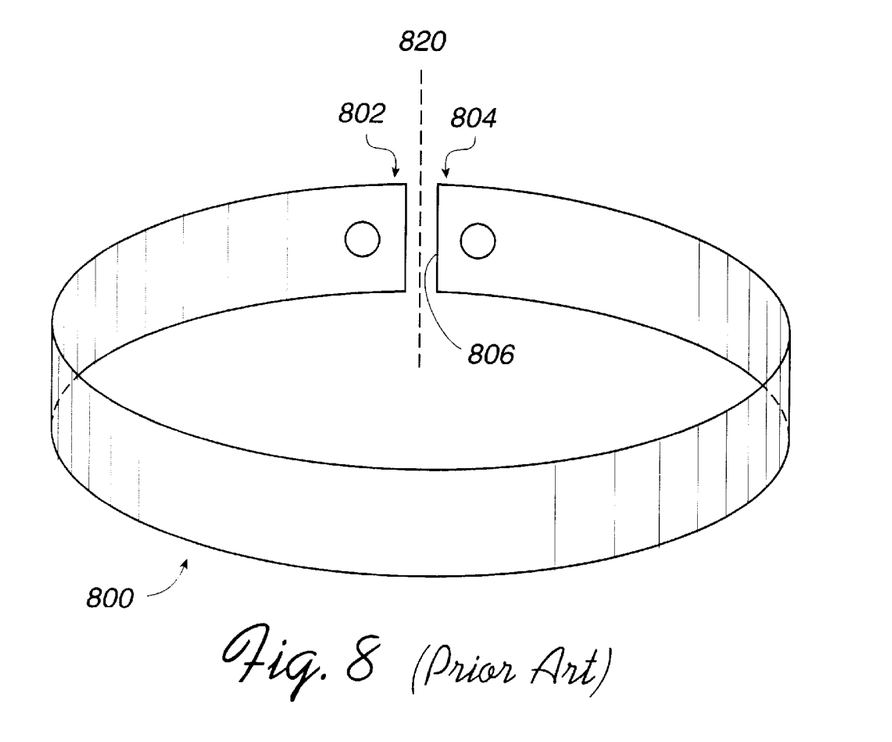
FIG. 8 is a perspective view of a prior coil.

In general, a coil for generating a plasma and for sputtering is designed so that the two ends of the coil do not touch to prevent shorting out the coil. FIG. 8 shows a previous single turn coil 800 having two ends 802 and 804 which are coupled to an RF generator and ground, respectively. The two ends 802 and 804 are spaced by a slot 806 which prevents the two ends from shorting. However, it has been recognized by the present applicant that the slot 806 may cause nonuniformity in the deposition of material onto the substrate. The present invention is directed to reducing or eliminating nonuniformity caused by such a slot.

The coil 104 is carried on the shield 105 by a plurality of coil standoffs 122 (FIG. 1) which electrically insulate the coil 104 from the supporting shield 105. As set forth in greater detail in copending application Ser. No. 08/853,024, entitled "Recessed Coil for Generating a Plasma," filed May 8, 1997 now U.S. Pat. No. 6,254,746 and assigned to the assignee of the present application, the insulating coil standoffs 122 have an internal labyrinth structure which permits repeated deposition of conductive materials from the target 110 onto the. coil standoffs 122 while preventing the formation of a complete conducting path of deposited material from the coil 104 to the shield 105 which could short the coil 104 to the shield 105 (which is typically at ground).

RF power is applied to the coil 104 by feedthroughs 200 which are supported by insulating feedthrough standoffs 124. The feedthrough standoffs 124, like the coil support standoffs 122, permit repeated deposition of conductive material from the target onto the feedthrough standoff 124 without the formation of a conducting path which could short the coil 104 to the shield 105. Thus, the coil feedthrough standoff 124 has an internal labyrinth structure somewhat similar to that of the coil standoff 122 to prevent the formation of a short between the coil 104 and the wall 140 of the shield.

The coil 104 of the illustrated embodiment is made of ½ by ⅛ inch heavy duty bead blasted solid high-purity (preferably 99.995% pure) titanium ribbon formed into a single turn coil having a diameter of 10–12 inches. However, other highly conductive materials and shapes may be utilized depending upon the material being sputtered and other factors. For example, the ribbon may be as thin as 1/16 inch and exceed 2 inches in height. Also, if the material to be sputtered is aluminum, both the target and the coil may be made of high purity aluminum. In addition to the ribbon shape illustrated, hollow tubing may be utilized, particularly if water cooling is desired.

Figure 3:
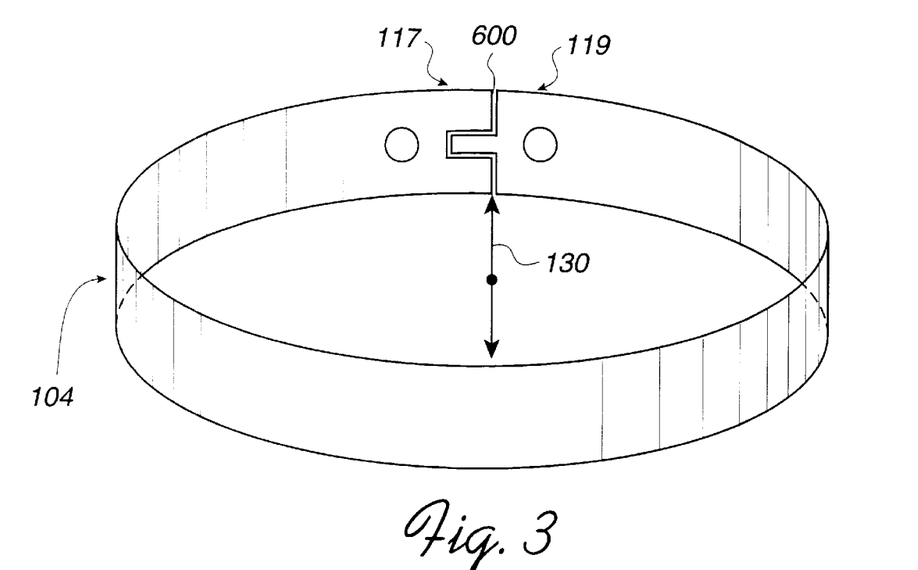
FIG. 3 is a perspective view of a coil in accordance with a first embodiment of the present invention.
Figure 4:
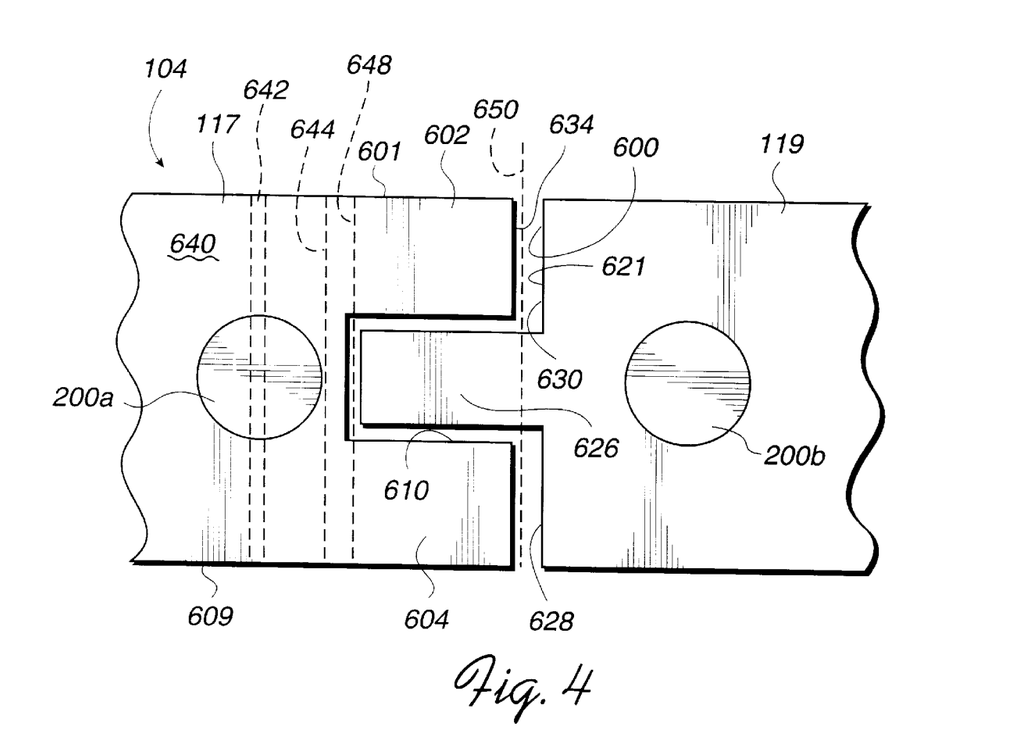
FIG. 4 is a partial elevational view of the coil in FIG. 3.

As best seen in FIGS. 3 and 4, and in accordance with one aspect of the present invention, the two ends 117 and 119 of the coil 104 are "axially overlapping" to encircle the full circumference of the substrate. The coil 104 of the illustrated embodiment is generally circular and defines a central axis 130 (FIG. 2) which is preferably aligned with the center axis 131 of the substrate and substrate holder. By the term "axially overlapping," it is meant that the coil ends overlap in a direction generally parallel to an axis of the substrate holder, which axis is orthogonal to the surface of the substrate holder carrying the substrate. The substrate holder axis defines the "vertical" direction of travel of the deposition material deposited onto the substrate from the coil. In the illustrated embodiment, this "axial" direction of the coil overlap is also in the same general direction as the axis of the chamber between the target 110 and the substrate 112. Thus, in the illustrated embodiment, both the direction of the coil to the substrate and the direction of the target to the substrate are "vertical" in the sense of an up or down direction (relative to gravity). However, it is anticipated that a chamber may be oriented at another direction such that the direction between the coil and the substrate may also have an orientation other than in an up or down direction (relative to gravity). Also, the coil central axis may not be aligned with the substrate or the coil may not be circular such that it may not have a central axis of symmetry. However, as used herein, the coil ends are considered to be "axially overlapping" regardless of actual coil to substrate orientation when the coil ends overlap in a direction generally parallel to the substrate holder axis.

As previously mentioned, the two ends 117 and 119 are coupled to the RF generator 106 and system ground, respectively. Accordingly, a slot 600 spaces the two ends 117 and 119 to prevent a short between the RF generator 106 and the system ground. Because the coil 104 has axially overlapping ends, the coil covers the full circumference of the substrate. In other words, any axial cross-section of the chamber plasma generation area which includes the substrate will also contain a portion of the coil 104 even in the vicinity of the slit. Consequently, a portion of the coil will be aligned with the substrate in every radial direction of the substrate. As a result, it is believed that deposition uniformity will be improved for those portions of the substrate aligned with the slot of the coil. By comparison, an axial cross-section taken along the line 820 within the slot 806 of the conventional coil shown in FIG. 8 will not contain a portion of the conventional coil because the ends of the coil 800 do not overlap. Hence, there may be a higher level of discontinuity in the sputtering rate adjacent the slot 806 as compared to the slot 600 for the coil 104 of FIGS. 3 and 4.

It is believed that sputtering rate uniformity along the circumference of the coil may be further improved by shifting the RF voltage distribution along the coil. As described in copending application Ser. No. 08/857,921, entitled "Use of Variable Impedance to Control Coil Sputter Distribution," filed May 16, 1997 pending and application Ser. No. 08/908,341, entitled "Use of Variable RF Generator to Control Coil Voltage Distribution," filed Aug. 7, 1997 now U.S. Pat. No. 6,345,588, such a shift may be accomplished in a variety of techniques including varying the impedances coupled to the coil and varying the power or frequency of the RF generator coupled to the coil.

It is also believed that the coil 104 of FIGS. 3 and 4 can improve the uniformity of the plasma density in the plasma generation area. For example, because the coil 104 completely encircles the plasma generation area, any DC bias induced on the coil may be distributed more uniformly around the periphery of the plasma generation area. As a result, the plasma density which may be affected by the DC bias on the coil may be more uniformly distributed as well. Consequently, deposition material passing through the plasma may be more uniformly ionized providing more uniform bottom coverage of high aspect ratio vias, trenches and other apertures in the substrate adjacent the coil gap. By comparison, prior coils having nonoverlapping ends may have an associated discontinuity in the DC fields generated by the DC bias on the coil with a corresponding disruption in the plasma density adjacent to the gap.

FIG. 4 shows a partial elevational view of the coil 104 in the vicinity of the slot 600 between the two ends 117 and 119. The coil end 117 is coupled by a feedthrough 200a to the RF generator 106 while the coil ends 119 is coupled by a feedthrough 200b to the blocking capacitor 120. As described in greater detail in aforementioned copending application Ser. No. 08/853,024, entitled "Recessed Coil for Generating a Plasma," filed May 8, 1997, the feedthroughs pass RF power through the shield 105 to the coil 104. The feedthroughs also support the coil 104 on the shield 105 but insulate the coil from the shield.

The end 117 has spaced protruding portions 602 and 604 which define a central recess 610 formed between the protruding portions 602 and 604. The end 119 has a central protruding portion 626 located above a recessed shoulder 628 and below a recessed shoulder 630.

The two ends 117 and 119 of the coil are overlapped in a spaced interdigitated fashion. More specifically, the protruding portion 626 of the end 119 is received by the notched recess area 610 of the end 117. However, every portion of the edge surface 634 of the end 600 is spaced from every portion of the shoulders 628 and 630 and central portions 626 of the end 119 to form the slot 600, so that a short between the RF generator 106 and the system ground can be prevented.

Although the slot 600 separates the two ends 117 and 119, the coil 104 effectively covers the full circumference of the substrate and the plasma generation area without any gap or break in the coverage because the protruding portion 626 of the end 119 overlaps axially with the protruding portions 602 and 604 of the end 117. In other words, every axial cross-section of the coil 104 taken around the full circumference of the plasma generation area contains a portion of the coil 104. No axial cross section of the coil 104 fails to include a portion of the coil 104.

The interior vertical face 640 of the coil 104 may be subdivided into a plurality of vertical areas spanning the full axial width of the coil as represented by a window area 642 indicated in phantom. If the window 642 is centered on an imaginary line 644 spaced from the recess 610 of the coil, the coil 104, the area enclosed by the window 642 overlaps the coil face 640 over the entire extent of the window 642. As a consequence, the coil 104 can sputter the maximum amount of coil material and couple the maximum amount of the RF energy within the vicinity of the imaginary line 644. However, if the window 642 is centered over an imaginary line 648 which intersects the recess 610, the area enclosed by the window 642 will not be entirely the surface of the coil because some of the area in the window 642 will enclose a portion of the slot 600 which is an absence of the coil material. Consequently, the portion of area of the window 642 which coincides with the coil surface will be less than one hundred percent (e.g., 75 percent) such that the sputtering rate adjacent the line 648 will be less than that adjacent the line 644. Although the sputtering rate will be even lower for a window centered around an imaginary line 650 between spaced shoulders 630 and 634, (e.g., 25 percent of the maximum), the sputtering rate for any vertical window area 642 does not reach zero anywhere around the full circumference of the plasma generation area because no window fails to include a portion of the coil 104. By comparison, however, if a window 642 was centered on the imaginary line 820 centered within the gap 806 of a previous coil shown in FIG. 8, the sputtering rate for such a window will be zero because there is a total absence of the coil material within the gap 410.

The gap between the coil ends should be sufficiently large to prevent arcing between the two ends which are at substantially different potentials. The gap should also be sufficiently large to prevent deposition material sputtered from the target from bridging between the two ends and electrically shorting the two ends together. On the other hand, the smaller the gap, the small the discontinuity in sputtering rate for those portions of the coil adjacent to the gap. In the illustrated embodiment, the gap of the slot 600 is approximately 4–8 mm, preferably approximately 6 mm. However, it is anticipated that gaps of other sizes may be selected depending upon the particular application as set forth above.

Figure 5:
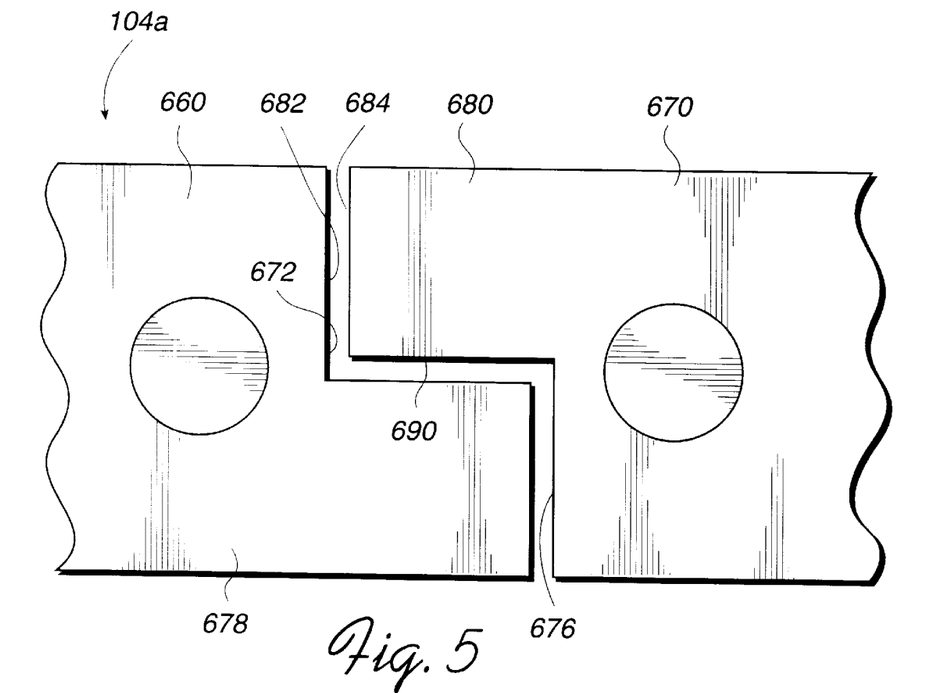
FIG. 5 is a partial elevational view of a coil in accordance with a second embodiment of the present invention.

FIG. 5 shows a partial elevational view of a coil 104a in accordance with a second embodiment of the present invention. The coil 104a is similar to the coil 104 of FIG. 4 except that the coil 104a is shaped differently at two ends 660 and 670. Instead of having a recess and a protruding portion approximately in the middle of the two ends like the coil 104, the coil 104a has complementary notched recess areas 672 and 676 at the two ends 660 and 670, respectively. The end 660 has a protruding portion 678 below the notched recess area 672. Conversely, the end 670 has a protruding portion 680 above the notched recess area 676. The protruding portion 680 of the end 670 is received by the notched recess area 672 of the end 660, and the protruding portion 678 of the end 660 is received by the notched recess area 676 of the end 670. However, every portion of the edge surface 682 of the end 660 is spaced from every portion of the edge surface 684 of the end 670 to form a slit 690 between the surfaces 682 and 684, so that a short between the RF generator 106 and the system ground can be prevented.

As with the coil 104, the coil 104a extends around the full circumference of the substrate without any gap or break in the coverage because the protruding portion 678 of the end 660 and the protruding portion 680 of the end 670 overlap each other axially.

Figure 6:
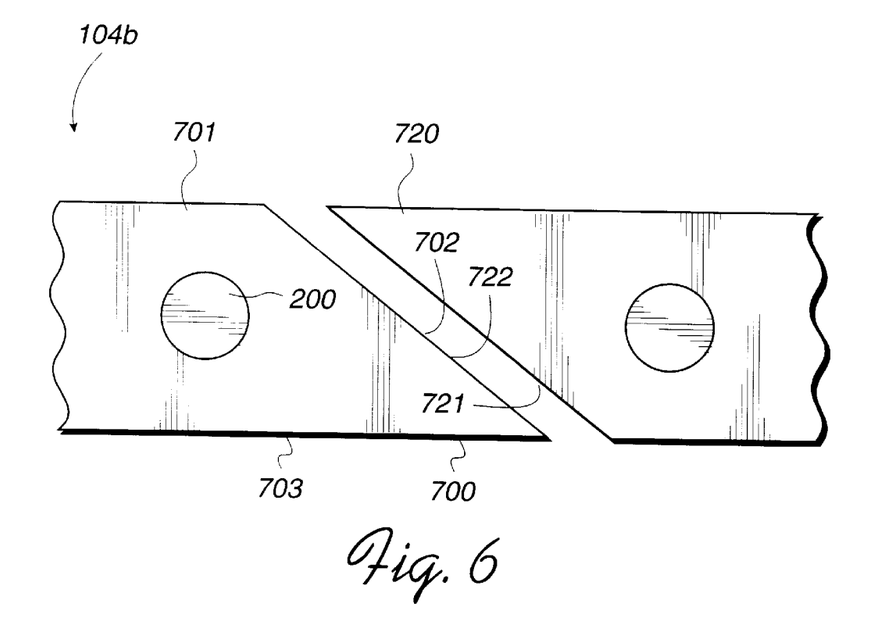
FIG. 6 is a partial elevational view of a coil in accordance with a third embodiment of the present invention.

FIG. 6 shows a partial elevational view of a coil 104b in accordance with a third embodiment of the present invention. The coil 104b is similar to the coil 104a of FIG. 5 in that two ends 700 and 720 of the coil 104b overlap axially so that the coil 104b extends around the full circumference of the plasma generation area without any gap or break in the coverage. However, the coil 104b has the two ends 700 and 720 shaped differently from the two ends of the coil 104a to form a slit 705 which is also shaped somewhat differently from the slit 680 of the coil 104a. The two ends 700 and 720 of the coil 104b area chamfered to have an approximately triangular shape, whereas the coils 104 and 104a have ends with protruding portions and notched recess areas that have generally rectangular shapes.

A slit 722, which has a shape of a diagonal slanting slope, is formed between the surfaces 702 and 721. The slit 722 spaces the two ends 700 and 720, but, as stated previously, the two ends 700 and 720 overlap axially so that the coil 104b extends around the full circumference of the substrate without any gap or break in the coverage. As with the coils 104 and 104a, the coil 104b will be able to sputter the coil material and couple energy around a full circumference of the plasma generation area because every radial cross-section of the coil 104b taken around the full circumference of the plasma generation area includes a portion of the coil 104b.

Figure 7:
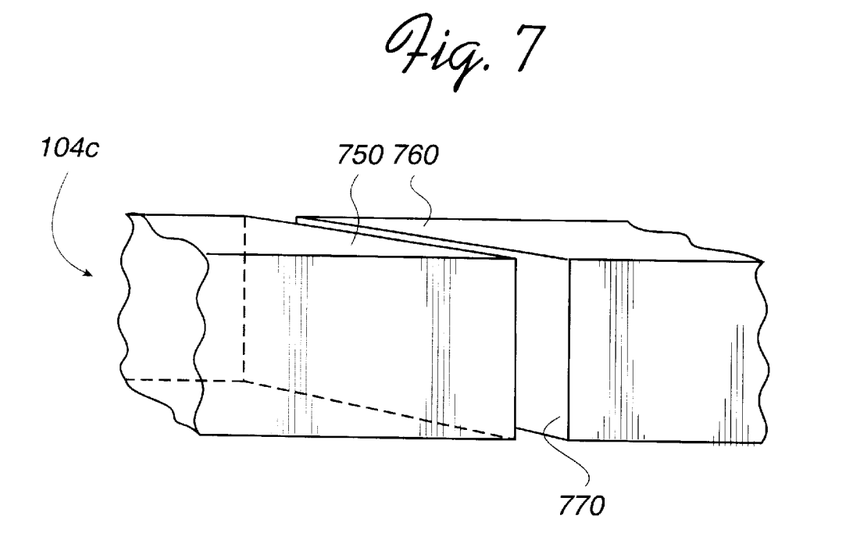
FIG. 7 is a partial perspective view of a coil in accordance with a fourth embodiment of the present invention.

FIG. 7 shows a coil 104c in accordance with a fourth embodiment of the present invention. The coil 104c is different from the previous coils 104, 104a and 104b in FIGS. 4–6 in that two ends 750 and 760 of the coil 104c overlap each other radially instead of overlapping axially like the previous coils 104, 104a and 104b. In other words, the end 760 is positioned "behind" the end 750 (i.e., between the end 750 and the shield 105) instead of being positioned axially above or below the end 750. Although the two ends of the coil 104c overlap radially instead of axially, the coil 104c still extends around a full circumference of the plasma generation area without any gap or break in the coverage so that any radial cross-section of the coil 104c taken around this full circumference of the plasma generation area contains a portion of the coil 104c just like the previous coils 104, 104a and 104b.

An axially oriented diagonal slit 770 spaces the two ends 750 and 770, so that a short between the RF generator 106 and the system ground can be prevented. Even though the two ends of the coil 104c overlap radially instead of axially, the coil 104c will be able to sputter the coil material and couple energy around a full circumference of the plasma generation area because every radial cross-section of the coil 104c taken around this full circumference of the plasma generation area includes a portion of the coil 104c.

As best seen in FIG. 1, the plasma chamber 100 has a dark space shield ring 132 which provides a ground plane with respect to the target 110 above which is negatively biased. In addition, as explained in greater detail in the aforementioned copending application Ser. No. 08/647,182, now abandonded, the shield ring 132 shields the outer edges of the target from the plasma to reduce sputtering of the target outer edges.

In the illustrated embodiment, the dark space shield 132 is a closed continuous ring of titanium (where titanium deposition is occurring in the chamber 100) or stainless steel having a generally inverted frusto-conical shape. The dark space shield extends inward toward the center of plasma chamber 100 so as to overlap the coil 104 by a distance of approximately 6 mm (1/40 inch). It is recognized, of course, that the amount of overlap can be varied depending upon the relative size and placement of the coil and other factors. For example, the overlap may be increased to increase the shielding of the coil 104 from the sputtered material but increasing the overlap could also further shield the target from the plasma which may be undesirable in some applications. In an alternative embodiment, the coil 104 may be placed in a recessed coil chamber (not shown) to further protect the coil and reduce particle deposits on the workpiece.

The plasma chamber 100 is supported by an adapter ring assembly 152 which engages the vacuum chamber. The chamber shield 105 is grounded to the system ground through the adapter ring assembly 152. The dark space shield 132, like the chamber shield 105, is grounded through the adapter ring assembly 152.

The target 110 is generally disk-shaped and is also supported by the adapter ring assembly 152. However, the target 110 is negatively biased and therefore should be insulated from the adapter ring assembly 152 which is at ground. Accordingly, seated in a circular channel formed in the underside of the target 110 is a ceramic insulation ring assembly 172 which is also seated in a corresponding channel 174 in the upper side of the target 152. The insulator ring assembly 172 which may be made of a variety of insulative materials including ceramics spaces the target 110 from the adapter ring assembly 152 so that the target 110 may be adequately negatively biased. The target, adapter and ceramic ring assembly are provided with O-ring sealing surfaces (not shown) to provide a vacuum tight assembly from the vacuum chamber to the target 110.

As explained in greater detail in copending application Ser. No. 08/680,335, it is believed that the amount of sputtering which originates from the coil 104 as compared to the sputtering which originates from the target 110 is a function of the RF power applied to the coil 104 relative to the DC power applied to the target 110. It is further believed that the relative amount of sputtering between the coil and the target may also be a function of the DC biasing of the coil 104 relative to that of the target 110.

It should also be recognized that the present invention is applicable to plasma chambers having more than one RF powered coil. For example, the present invention may be applied to multiple coil chambers for launching helicon waves of the type described in copending application Ser. No. 08/559,345, filed Nov. 15, 1995 now U.S. Pat. No. 6,264,812 for "Method and Apparatus for Launching a Helicon Wave in a Plasma" which is assigned to the assignee of the present application and is incorporated herein by reference.

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz or 13.56 MHz but it is anticipated that the range can vary from, for example, 1 MHz to 15 MHz.

In the illustrated embodiments above, the chamber shield 105 has a diameter of 400 mm (16"), but it is anticipated that satisfactory results can be obtained with a diameter in the range of 150–635 mm (6"–25"). The chamber shield 105 may be fabricated from a variety of materials including insulative materials such as ceramics or quartz. However, the chamber shield 105 and all metal surfaces likely to be coated with the target material are preferably made of a material such as stainless steel or copper, unless made of the same material as the sputtered target material. The material of the structure which will be coated should have a coefficient of thermal expansion which closely matches that of the material being sputtered to reduce flaking of sputtered material from the chamber shield 105 or other structure onto the substrate 112. In addition, the material to be coated should have good adhesion to the sputtered material. Thus for example if the deposited material is titanium, the preferred metal of the chamber shield 105, standoffs 122 and 124 and other structures likely to be coated is bead-blasted titanium. Any surfaces which are more likely to sputter, such as the end caps of the coil and feedthrough standoffs 122 and 124, would preferably be made of the same type of material as the target 110, such as high-purity, bead-blasted titanium, for example. Of course, if the material to be deposited is a material other than titanium, the preferred metal is the deposited material, stainless steel, for example. Adherence can also be improved by coating the structures with molybdenum prior to sputtering the target 110. However, it is preferred that the coil 104 (or any other surface likely to sputter) not be coated with molybdenum or other materials since the molybdenum can contaminate the substrate 112 if sputtered from the coil 104.

The substrate 112 to target 110 spacing is in a range of about 120–150 mm, preferably about 140 mm (about 5.5"), but can also range from about 38 to 200 mm (1.5" to 8"). For this wafer to target spacing, suitable stepped wafer bottom coverage may be achieved with a coil diameter of 290 mm (11.5 inches) spaced from the target by a distance of approximately 50 mm (1.9 inches). It has been found that increasing the diameter of the coil which moves the coil away from the workpiece edge may have an adverse effect on bottom coverage. On the other hand, decreasing the coil diameter to move the coil closer to the wafer edge can adversely affect layer uniformity.

Deposition uniformity also appears to be a function of coil spacing from the target. As previously mentioned, a spacing of 50 mm (1.9 inches) between the coil and target may be found satisfactory for a target to wafer spacing of 140 mm. Moving the coil vertically either toward or away from the target (or wafer) can adversely affect deposition layer uniformity.

A variety of precursor gases may be utilized to generate the plasma including Ar, $H_2$, $O_2$ or reactive gases such as $NF_3$, $CF_4$ and many others. Various precursor gas pressures are suitable including pressures of 0.1–50 mTorr which includes the exemplar pressures set forth in FIG. 3. However, pressures between 10 mTorr and 50 mTorr facilitate ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for sputtering material onto a workpiece, comprising:
    a chamber;
    a holder having a surface for supporting said workpiece wherein said workpiece holder surface defines an axis generally orthogonal to said workpiece holder surface;
    a plasma generation area adjacent said holder; and
    a coil adapted to couple RF energy into a plasma in said plasma generation area, said coil comprising a conductive member having a first end and a second end spaced from but immediately adjacent to said first end to define a slot therebetween, wherein said first coil end and said second coil end overlap in a direction generally parallel to said workpiece holder axis.

2. The apparatus of claim 1 wherein said coil is a single turn coil.

3. The apparatus of claim 2, wherein said first end has a protruding portion and said second end defines a recess such that said protruding portion is received by but spaced from said recess.

4. The apparatus of claim 2, wherein said first and second ends are chamfered.

5. The apparatus of claim 1, wherein said coil conductive member is generally circular in shape and defines a central axis and said first end and said second end overlap in a direction parallel to said central axis.

6. The apparatus of claim 1, wherein said first and second ends are chamfered.

7. The apparatus of claim 1, wherein said first end has a protruding portion and said second end defines a recess such that said protruding portion is received by but spaced from said recess.

8. The apparatus of claim 1, wherein said first end has at least one protruding portion and at least one recess, and said second end has at least one protruding portion and at least one recess such that said protruding portion of said first end is received by said recess of said second end and said protruding portion of said second end is received by said recess of said first end.

9. The apparatus of claim 1, further comprising a sputter target positioned within said chamber to provide a source of sputtered deposition material wherein said coil conductive member is formed of the same type of material as said target and is positioned to sputter said coil material onto said workpiece so that both said coil material and said target material are deposited on said work piece to form a layer thereon.

10. The apparatus of claim 1 wherein said coil encircles said plasma generation area and said workpiece holder.

11. The apparatus of claim 10, wherein said coil is axially displaced relative to said workpiece holder.

12. The apparatus of claim 1 wherein said second end is spaced from said first end by 4–8 mm.

13. The apparatus of claim 12 wherein said second end is spaced from said first end by 6 mm.

14. An apparatus for sputtering material onto a workpiece, comprising:

a chamber;

a holder having a surface for supporting said workpiece;

a plasma generation area adjacent said holder; and a coil adapted to couple RF energy into a plasma in said plasma generation area, said coil comprising a conductive member having a first end and a second end spaced from but immediately adjacent to said first end to define a slot therebetween wherein said coil defines a radius and said first end and said second end overlap radially.

15. The apparatus of claim 7, wherein said coil conductive member is generally circular in shape and defines a central axis and a radius of substantially constant length and orthogonal to said central axis and said first end and said second end overlap in a radial direction orthogonal to said central axis.

16. The apparatus of claim 14, wherein said first and second ends are chamfered.

17. The apparatus of claim 14, wherein said first end has a protruding portion and said second end defines a recess such that said protruding portion is received by but spaced from said recess.

18. The apparatus of claim 14 wherein said second end is spaced from said first end by 4–8 mm.

19. The apparatus of claim 18 wherein said second end is spaced from said first end by 6 mm.

20. An apparatus for sputtering material onto a workpiece, comprising:

a chamber;

a target disposed in said chamber for sputtering said material onto said workpiece;

a holder for said workpiece;

a generally cylindrical shaped plasma generation area between said target and said holder; and a single turn circular coil encircling said plasma generation area and adapted to inductively couple RF energy into a plasma in said plasma generation area, said coil having a first end and a second end spaced from but overlapping said first end wherein said first end has a protruding portion and said second end defines a recess such that said protruding portion is received by but spaced from said recess.

21. The apparatus of claim 20 wherein said second end is spaced from said first end by 4–8 mm.

22. A method of processing a semiconductor device, comprising:

radiating RF energy from a coil into a plasma generation area containing a plasma energized by said coil, said coil comprising a conductive member having two spaced but immediately adjacent and overlapping ends which define a slot therebetween wherein said coil first end and said coil second end overlap in a direction generally parallel to a semiconductor device holder axis generally orthogonal to a semiconductor device holder surface; and sputtering material from said coil conductive member onto said semiconductor device to form a layer of said material on said semiconductor device.

23. The method of claim 22 wherein said coil is a single turn coil.

24. The method of claim 23, wherein said first end has a protruding portion and said second end defines a recess such that said protruding portion is received by but spaced from said recess.

25. The method of claim 23, wherein said first and second ends are chamfered.

26. The method of claim 22, wherein said coil conductive member is generally circular in shape and defines a central axis and said first end and said second end overlap in a direction parallel to said central axis.

27. The method of claim 22, wherein said first and second ends are chamfered.

28. The method of claim 22, wherein said first end has a protruding portion and said second end defines a recess such that said protruding portion is received by but spaced from said recess.

29. The method of claim 22, wherein said first end has at least one protruding portion and at least one recess, and said second end has at least one protruding portion and at least one recess such that said protruding portion of said first end is received by said recess of said second end and said protruding portion of said second end is received by said recess of said first end.

30. The method of claim 22, further comprising a sputter target positioned within said chamber to provide a source of sputtered deposition material wherein said coil conductive member is formed of the same type of material as said target and is positioned to sputter said coil material onto said workpiece so that both said coil material and said target material are deposited on said work piece to form a layer thereon.

31. The method of claim 22 wherein said coil encircles said plasma generation area and said semiconductor device holder.

32. The method of claim 31, wherein said coil is axially displaced relative to said semiconductor device holder.

33. The method of claim 22 wherein said second end is spaced from said first end by 4–8 mm.

34. A method of processing a semiconductor device, comprising:

radiating RF energy from a coil into a plasma generation area containing a plasma energized by said coil, said coil comprising a conductive member having first and second spaced but immediately adjacent and overlapping ends to define a slot therebetween wherein said coil defines a radius and said first end and said second end overlap radially; and sputtering material from said coil conductive member onto said semiconductor device to form a layer of said material on said semiconductor device.

35. The method of claim 34, wherein said coil conductive member is generally circular in shape and defines a central axis and a radius of substantially constant length and orthogonal to said central axis and said first end and said second end overlap in a radial direction orthogonal to said central axis.

36. The method of claim 34, wherein said first and second ends are chamfered.

37. The method of claim 34, wherein said first end has a protruding portion and said second end defines a recess such that said protruding portion is received by but spaced from said recess.

38. The method of claim 34 wherein said second end is spaced from said first end by 4–8 mm.

39. A method of depositing deposition material onto a workpiece, comprising:

coupling energy from a single turn coil into a plasma generation area to generate a plasma to ionize said material, said coil covering a full circumference of said plasma generation area by having first and second spaced but overlapping ends wherein said first end has a protruding portion and said second end defines a recess such that said protruding portion is received by but spaced from said recess; and sputtering said material from said coil onto said workpiece to form a layer of said material on said workpiece.

40. The method of claim 39 wherein said second end is spaced from said first end by 4–8 mm.

* * * * *